United States Patent
Song (10) Patent No.: US 11,387,285 B2
(45) Date of Patent: Jul. 12, 2022

(54) DISPLAY SUBSTRATE AND MANUFACTURING METHOD THEREOF INCLUDING DEPOSITING DIFFERENT QUANTUM DOT SOLUTIONS WETTABLE TO DIFFERENT MATERIAL LAYERS

(71) Applicant: BOE TECHNOLOGY GROUP CO., LTD., Beijing (CN)

(72) Inventor: Youngsuk Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 260 days.

(21) Appl. No.: 16/760,223

(22) PCT Filed: Nov. 29, 2019

(86) PCT No.: PCT/CN2019/121898
§ 371 (c)(1),
(2) Date: Apr. 29, 2020

(87) PCT Pub. No.: WO2020/173159
PCT Pub. Date: Sep. 3, 2020

(65) Prior Publication Data
US 2021/0217815 A1    Jul. 15, 2021

(30) Foreign Application Priority Data
Feb. 25, 2019   (CN) .......................... 201910136915.8

(51) Int. Cl.
*H01L 27/32* (2006.01)
*H01L 51/56* (2006.01)

(52) U.S. Cl.
CPC ........ *H01L 27/322* (2013.01); *H01L 27/3244* (2013.01); *H01L 51/56* (2013.01); *H01L 2227/323* (2013.01)

(58) Field of Classification Search
CPC . H01L 27/322; H01L 27/3244; H01L 51/502; H01L 51/56; H01L 31/0352
(Continued)

(56) References Cited

U.S. PATENT DOCUMENTS

2006/0091547 A1* 5/2006 Sakai .................. H01L 51/0004
                                                                257/773
2006/0092191 A1* 5/2006 Sakai .................. H01L 27/1292
                                                                257/E27.111
(Continued)

FOREIGN PATENT DOCUMENTS

CN           1769988 A      5/2006
CN           1790664 A      6/2006
(Continued)

*Primary Examiner* — Matthew E. Gordon
(74) *Attorney, Agent, or Firm* — The Webb Law Firm (57) ABSTRACT

The present disclosure relates to a display substrate and a manufacturing method thereof, and a display device. The display substrate includes a plurality of pixel units each including a first sub-pixel and a second sub-pixel. The method includes: forming a first material layer and a patterned second material layer, the first material layer including a portion corresponding to an area between the first and second sub-pixels, and the second material layer has a first opening exposing the portion of the first material layer, corresponding to the area between the first and second sub-pixels; and forming a first quantum dot solution in a first area corresponding to the first sub-pixel, on the second material layer to form a first color filter sublayer, wherein wettability of the second material layer to the first quantum dot solution is greater than wettability of the first material layer to the first quantum dot solution.

20 Claims, 8 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2009/0085473 A1* | 4/2009 | Iizumi | ................. H01L 51/0012 |
| | | | 313/504 |
| 2011/0227080 A1 | 9/2011 | Roh et al. | |
| 2017/0170160 A1* | 6/2017 | Yen | ..................... H01L 27/1262 |
| 2017/0261848 A1* | 9/2017 | Tang | ...................... G02B 5/206 |
| 2017/0330867 A1* | 11/2017 | Zou | .................... H01L 33/0095 |
| 2018/0031911 A1* | 2/2018 | Liu | .................... G02F 1/133514 |
| 2018/0067363 A1* | 3/2018 | Li | ................. G02F 1/133621 |
| 2019/0214604 A1* | 7/2019 | Zhen | ............... H01L 31/035218 |
| 2020/0004081 A1* | 1/2020 | Chen | ................. G02F 1/133514 |

FOREIGN PATENT DOCUMENTS

| | | | |
|---|---|---|---|
| CN | 101425565 A | 5/2009 | |
| CN | 105259694 A | 1/2016 | |
| CN | 105278155 A | 1/2016 | |
| CN | 105589250 A | 5/2016 | |
| CN | 106158916 A | 11/2016 | |
| CN | 107065308 A | 8/2017 | |
| CN | 108511390 A | 9/2018 | |
| CN | 108832011 A | 11/2018 | |
| CN | 109300395 A | 2/2019 | |
| CN | 109786431 A | 5/2019 | |
| EP | 1521106 | 4/2005 | |
| JP | 2004138695 A | 5/2004 | |
| JP | 2005085465 A | 3/2005 | |

* cited by examiner

DISPLAY SUBSTRATE AND MANUFACTURING METHOD THEREOF INCLUDING DEPOSITING DIFFERENT QUANTUM DOT SOLUTIONS WETTABLE TO DIFFERENT MATERIAL LAYERS

CROSS-REFERENCE TO RELATED APPLICATIONS

This application is the United States national phase of PCT/CN2019/121898 filed Nov. 29, 2019, and claims priority to the Chinese Patent Application No. 201910136915.8 filed on Feb. 25, 2019, the disclosures of which are hereby incorporated by reference in their entirety.

TECHNICAL FIELD

The present disclosure relates to the technical field of display, and particularly to a display substrate and a manufacturing method thereof, and a display device.

BACKGROUND

With the rapid development of display technologies, people have increasingly higher requirements for the performance of display products. The quantum dot material has a narrower spectrum half-peak width and a higher purity of the emitted light color, which can improve the color gamut of the display products, and thus is widely concerned and researched.

At present, a main application of the quantum dot technology is to use a quantum dot color filter in a color filter substrate, and to cooperate with a backlight source for display. In related manufacturing processes, the quantum dot color filter is realized through ink-jet printing and other solution preparation processes. In the ink-jet printing, the quantum dot color filter is patterned with the aid of bank(s) to prevent color mixing.

SUMMARY

According to a first aspect of the embodiments of the present disclosure, a method of manufacturing a display substrate is provided. The display substrate comprises a plurality of pixel units, each of the plurality of pixel units comprising a first sub-pixel and a second sub-pixel. The method of manufacturing the display substrate comprises: forming a first material layer and a patterned second material layer, wherein the first material layer comprises a portion corresponding to an area between the first sub-pixel and the second sub-pixel, and the second material layer has a first opening exposing the portion of the first material layer, corresponding to the area between the first sub-pixel and the second sub-pixel; and forming a first quantum dot solution in a first area corresponding to the first sub-pixel, on the second material layer to form a first color filter sublayer, wherein wettability of the second material layer to the first quantum dot solution is greater than the wettability of the first material layer to the first quantum dot solution.

In some embodiments, the method of manufacturing further comprises: performing surface treatment on the second material layer to form a second surface layer on a surface of the second material layer before the step of forming, wherein wettability of the second surface layer to the first quantum dot solution is greater than the wettability of the second material layer to the first quantum dot solution.

In some embodiments, the method of manufacturing further comprises: performing surface treatment on the exposed first material layer to form a first surface layer on a surface of the exposed first material layer before the step of forming, wherein wettability of the first surface layer to the first quantum dot solution is smaller than the wettability of the first material layer to the first quantum dot solution.

In some embodiments, the surface treatment is performed using CFx plasma.

In some embodiments, the first material layer further comprises a first portion and a second portion corresponding to the first sub-pixel and the second sub-pixel, respectively.

In some embodiments, the second material layer comprises an organic material layer and the first material layer comprises a thin film encapsulation layer.

In some embodiments, the second material layer comprises an organic material layer comprising at least one of an alkyl group and a benzene ring.

In some embodiments, the second material layer comprises: a first filtering material layer for filtering out light with a wavelength of 500 nm or more.

In some embodiments, the method of manufacturing further comprises: forming a second quantum dot solution in a second area corresponding to the second sub-pixel, on the second material layer to form a second color filter sublayer, wherein wettability of the second material layer to the second quantum dot solution is greater than the wettability of the first material layer to the second quantum dot solution.

In some embodiments, the method of manufacturing further comprises: forming a second filtering material layer that covers the first color filter sublayer and the second color filter sublayer, for filtering out light with a wavelength of 500 nm or less.

In some embodiments, each pixel unit further comprises a third sub-pixel, the second sub-pixel being located between the first sub-pixel and the third sub-pixel; the first material layer further comprises a third portion corresponding to the third sub-pixel; the second material layer further has a second opening exposing the third portion corresponding to the third sub-pixel, of the first material layer.

In some embodiments, the first material layer is hydrophilic, the second material layer is hydrophobic, and the first quantum dot solution is hydrophobic.

According to a second aspect of the embodiments of the present disclosure, there is provided a display substrate comprising a plurality of pixel units, each of the plurality of pixel units comprising a first sub-pixel and a second sub-pixel. The display substrate comprises: a first material layer located on a base substrate and comprising a first portion corresponding to an area between the first sub-pixel and the second sub-pixel; a second material layer located on the base substrate, wherein the second material layer has a first opening exposing the first portion of the first material layer, corresponding to the area between the first sub-pixel and the second sub-pixel; and a first color filter sublayer located in a first area corresponding to the first sub-pixel, on the second material layer, wherein wettability of the second material layer to a quantum dot solution for forming the first color filter sublayer is greater than the wettability of the first material layer to the quantum dot solution.

In some embodiments, the display substrate further comprises: a first surface layer located on a surface on a side of the first material layer away from the base substrate, wherein wettability of the first surface layer to the quantum dot solution is smaller than the wettability of the first material layer to the quantum dot solution.

In some embodiments, the first material layer further comprises a first portion and a second portion corresponding to the first sub-pixel and the second sub-pixel, respectively.

In some embodiments, the display substrate further comprises: a second surface layer located on a surface on a side of the second material layer away from the base substrate, wherein wettability of the second surface layer to the quantum dot solution is greater than the wettability of the second material layer to the quantum dot solution.

In some embodiments, the second material layer comprises an organic material layer and the first material layer comprises a thin film encapsulation layer.

In some embodiments, the second material layer comprises an organic material layer comprising at least one of an alkyl group and a benzene ring.

In some embodiments, the quantum dot color filter further comprises: a second color filter sublayer located in a second area corresponding to the second sub-pixel, on the second material layer.

In some embodiments, the quantum dot color filter further comprises: a second filtering material layer that covers the first color filter sublayer and the second color filter sublayer, for filtering out light with a wavelength of 500 nm or less.

In some embodiments, the display substrate further comprises: a light-emitting unit located on the base substrate, wherein the first color filter sublayer is arranged on a light-emitting side of the light-emitting unit.

According to a third aspect of the embodiments of the present disclosure, there is provided a display device, comprising the display substrate according to any one of the above embodiments.

Further features of the present disclosure and advantages thereof will become apparent from the following detailed description of exemplary embodiments with reference to the attached drawings.

BRIEF DESCRIPTION OF THE DRAWINGS

The accompanying drawings, which constitute a part of the specification, illustrate the embodiments of the present disclosure and, together with the description, serve to explain the principles of the present disclosure.

The present disclosure will be understood more clearly according to the following detailed description with reference to the accompanying drawings.

Please be appreciated that, the sizes of various portions shown in the accompanying drawings are not drawn to actual scale. Furthermore, identical or similar reference numerals are used to refer to identical or similar members.

DETAILED DESCRIPTION

Various exemplary embodiments of the present disclosure will be described in detail with reference to the accompanying drawings in the following. The following description of the exemplary embodiments is merely illustrative in nature and is in no way intended to limit this disclosure, its application, or uses. The present disclosure may be implemented in many different forms and is not limited to the embodiments described herein. These embodiments are provided merely for making the present disclosure thorough and complete, and sufficiently expressing the scope of the present disclosure to one of ordinary skill in the art. It should be noted that the relative arrangement of the components and steps, compositions of materials, the numerical expressions, and numerical values set forth in these embodiments are interpreted to be merely illustrative instead of restrictive, unless it is specifically stated otherwise.

The words "first", "second" and the like used in the present disclosure do not imply any sequence, number or importance, but are merely used to distinguishing different portions. The word "comprise" or "comprise" or the like means that an element preceding the word covers elements listed following the word, but does not preclude the possibility of covering also other elements. The terms "up", "down", "left", "right" and the like are merely used for implying relative position relations, and after an absolute position of the object described changes, the relative position relation may possibly change correspondingly.

In this disclosure, when a specific element is described between a first element and a second element, an intermediate element may exist between the specific element and the first element or the second element, or an intermediate element may not exist.

All terms (comprising technical or scientific terms) used in this disclosure have the same meanings as understood by one of ordinary skill in the art, unless otherwise specifically defined. It should also be understood that the terms defined in common dictionaries should be interpreted as having meanings consistent with their meanings in the context of the relevant art, but should not be interpreted with idealized or extremely formalized meanings, unless otherwise expressly defined herein.

Techniques, methods and apparatus as known by one of ordinary skill in the relevant art may not be discussed in detail, but are intended to be regarded as a part of the specification where appropriate.

The embodiments of the disclosure provides a method of manufacturing a display substrate, which can realize patterning of a quantum dot color filter without the need of bank(s).

Figure 1A:
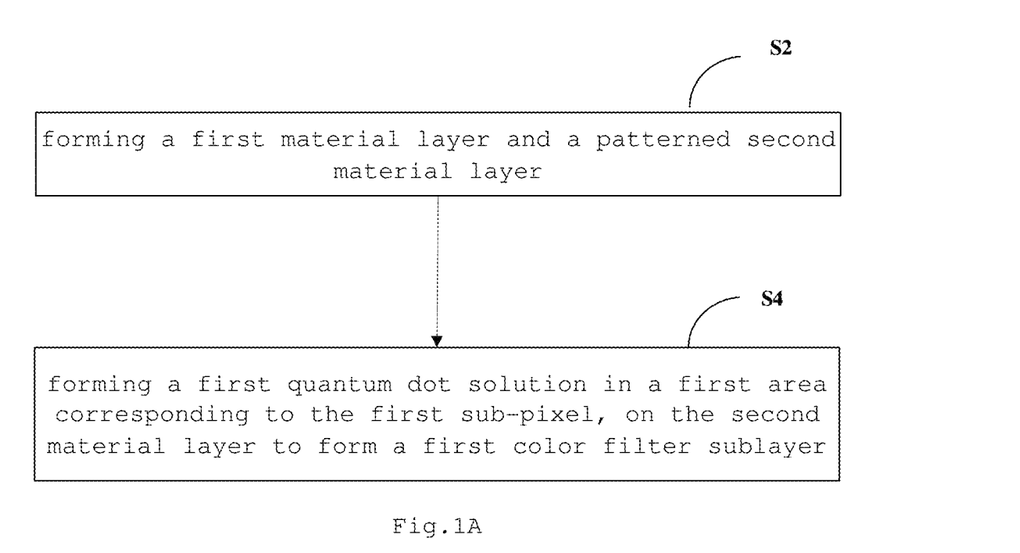
FIG. 1A is a flowchart illustrating a method of manufacturing a display substrate according to an embodiment of the present disclosure.
Figure 2A:
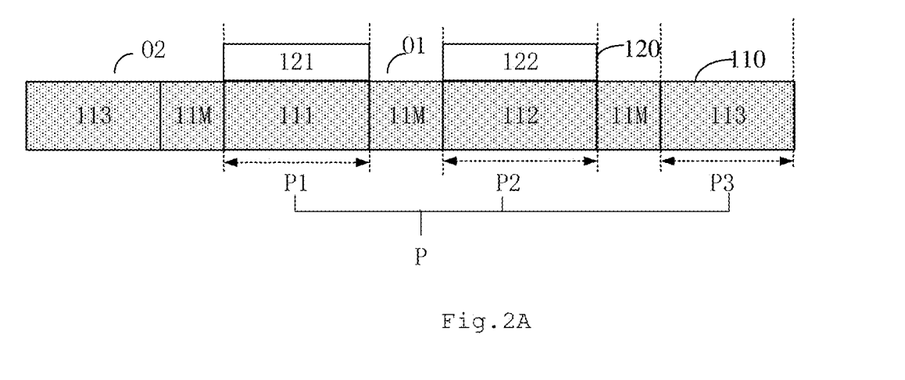
FIGS. 2A and 2B are sectional views showing a structure obtained at various stages according to the manufacturing method of FIG. 1A.
Figure 2B:
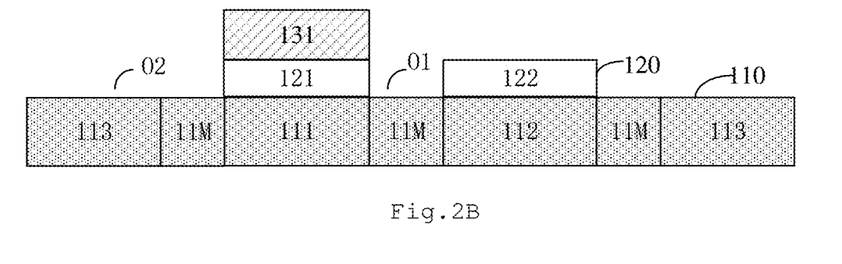

FIG. 1A is a flowchart illustrating a method of manufacturing a display substrate according to an embodiment of the present disclosure. FIGS. 2A to 2B are sectional views illustrating a structure obtained at various stages according to the method of FIG. 1. Sectional views of a structure obtained at various stages of the method according to some embodiments of the present disclosure, shown in FIGS. 2A-2B, are described below with reference to the flowchart shown in FIG. 1A.

As shown in FIG. 1A, the method of manufacturing a display substrate comprises steps S2-S4.

In step S2, a first material layer 110 and a patterned second material layer 120 are formed.

The first material layer may be formed on a base substrate. In some embodiments, the first material layer comprises a first portion corresponding to an area between the first sub-pixel and the second sub-pixel. That is, the first material layer may be disposed only between adjacent sub-pixels, but not disposed at positions corresponding to the first sub-pixel and the second sub-pixel. In this case, the patterned second material layer does not coincide with a projection of the first material layer on the base substrate.

In some other embodiments, the first material layer further comprises a second portion corresponding to the first sub-pixel and the second sub-pixel. That is, the first material layer is also disposed at positions corresponding to the first sub-pixel and the second sub-pixel. The patterned second material layer is formed on the first material layer. In this case, the patterned second material layer partially coincides with the projection of the first material layer on the base substrate.

FIG. 2A illustrates a sectional view after forming the first material layer and the second material layer, according to an embodiment of the present disclosure. As shown in FIG. 2A, the display substrate comprises a plurality of pixel units P. Each pixel unit P comprises a plurality of sub-pixels, for example, a first sub-pixel P1 and a second sub-pixel P2. In some embodiments, each pixel unit P further comprises a third sub-pixel P3, wherein the second sub-pixel P2 is located between the first sub-pixel P1 and the third sub-pixel P3.

As shown in FIG. 2A, the first material layer 110 comprises portions 11M corresponding to areas between different sub-pixels (e.g., a first sub-pixel and a second sub-pixel). In some embodiments, the first material layer 110 further comprises a first portion 111 and a second portion 112 corresponding to the first sub-pixel and the second sub-pixel, respectively. In some other embodiments, the first material layer 110 further comprises a third portion 113 corresponding to the third sub-pixel.

In some embodiments, the first material layer 110 is hydrophilic. The material of the first material layer 110 may be a cathode material layer, and may also be a thin film encapsulation layer (TFE). The material of the cathode material layer may comprise transparent Indium Tin Oxide (ITO), Indium Zinc Oxide (IZO), graphite (graphene), Carbon Nano tube (CNT), or translucent Li, Ag, Ca, Al, Mg. TFE is, for example, an inorganic material selected from SiNx, SiO, SiON, SiC, SiCN, or AlO. In some embodiments, TFE is a multilayer structure of inorganic and organic materials, and the surface near the second material layer is an inorganic material. The organic material may be selected from an acrylic resin (acryl), an epoxy resin (epoxy), or any combination thereof.

In other embodiments, the first material layer comprises a transparent material layer, through which blue light having a wavelength in the range of, for example, 400 nm to 480 nm can transmit.

After forming the second material layer on the first material layer, patterning of the second material layer may be achieved using a low temperature photolithography process. The photolithography process generally comprises steps of applying a photoresist, baking, exposing, developing, etching, and the like. The low temperature photolithography process refers to a lower baking temperature, e.g., less than 100 degrees. In some embodiments, the baking temperature is 80-85 degrees, so that the cured second material layer has a good stability.

As shown in FIG. 2A, the second material layer 120 covers the first portion 111 and the second portion 112 of the first material layer 110. The second material layer 120 has a first opening O1. The first opening O1 exposes the portion 11M of the first material layer 110, corresponding to the area between the first sub-pixel and the second sub-pixel. The second material layer 120 may also have a second opening O2. The second opening O2 exposes a portion 113 of the first material layer 110, corresponding to the third sub-pixel.

In some embodiments, the second material layer 120 is hydrophobic. The material of the second material layer 120 may comprise an organic material layer, for example, an organic material layer comprising at least one of an alkyl group and a benzene ring.

In other embodiments, the material of the second material layer comprises a first filtering material layer. The first filtering material layer is used for filtering out light with a wavelength of more than 500 nm, to avoid a poor contrast due to an anode reflection of the external incident light.

In step S4, a first quantum dot solution is formed in a first area 121 corresponding to the first sub-pixel, on the second material layer 120, so as to form a first color filter sublayer 131.

As an example, the first quantum dot solution may be formed by a solution preparation process such as ink-jet printing, spin coating, or screen printing. The quantum dot solution comprises components such as organic solvents, quantum dot materials, and other additives. In some embodiments, the first quantum dot solution is hydrophobic. Since the wettability of the second material layer to the first quantum dot solution is greater than the wettability of the first material layer to the first quantum dot solution, the first quantum dot solution will flow from the surface of the first material layer (e.g., 11M) to the surface of the first area 121 of the second material layer. After the first quantum dot solution is dried, the first color filter sublayer 131 is formed. It should be understood that, in the process of forming the first color filter sublayer 131, a mask may be used to mask a second area 122 corresponding to the second sub-pixel, on the second material layer 120.

FIG. 2B illustrates a sectional view after forming the first color filter sublayer, according to one embodiment of the present disclosure. As shown in FIG. 2B, the first color filter sublayer 131 is located in the first area 121 corresponding to the first sub-pixel, on the second material layer 120.

Figure 1B:
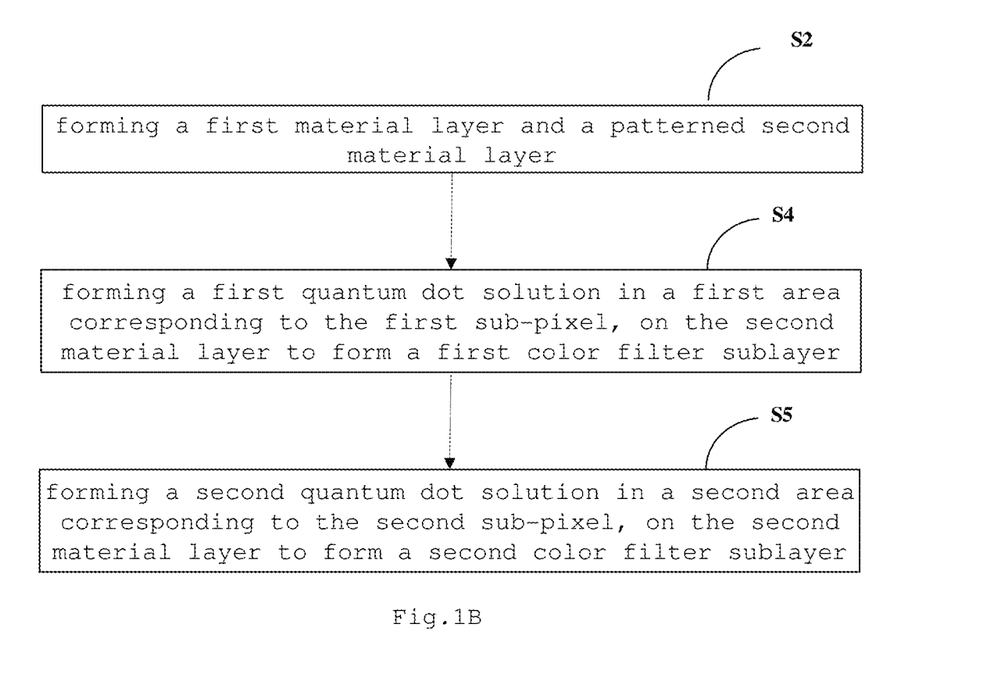
FIG. 1B is a flowchart illustrating a method of manufacturing a display substrate according to another embodiment of the present disclosure.
Figure 2C:
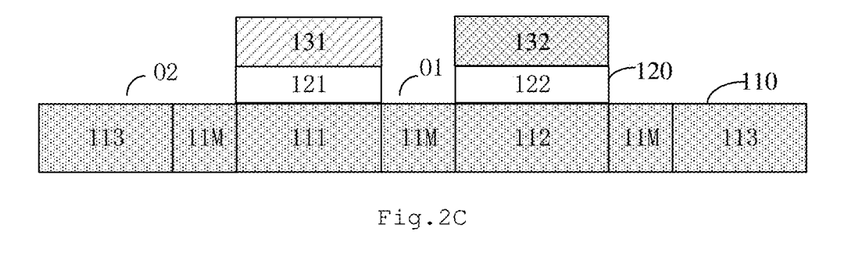
FIG. 2C is a sectional view after forming the second color filter sublayer according to the manufacturing method of FIG. 1B.

FIG. 1B is a flowchart illustrating a method of manufacturing a display substrate according to another embodiment of the present disclosure. FIG. 1B is different from FIG. 1A in that FIG. 1B further comprises a step S5. FIG. 2C is a sectional view illustrating a structure obtained at the step S5 according to the method of FIG. 1B. The flowchart shown in FIG. 1B is described below with reference to FIG. 2C, wherein only the differences between FIG. 1B and FIG. 1A are described, and the same parts between the two are omitted.

In FIG. 1B, the method of manufacturing a display substrate further comprises: step S5 of forming a second quantum dot solution in a second area corresponding to the second sub-pixel, on the second material layer, so as to form a second color filter sublayer 132. The second color filter sublayer 132 may be formed by a process similar to that of the first color filter sublayer 131. The wettability of the second material layer to the second quantum dot solution is also greater than the wettability of the first material layer to the second quantum dot solution.

FIG. 2C is a sectional view after forming the second color filter sublayer 132 according to an embodiment of the present disclosure. As shown in FIG. 2C, the second color filter sublayer 132 is disposed in the second area 122 corresponding to the second sub-pixel, on the second material layer 120.

In the above embodiments, in the solution preparation process such as ink-jet printing, patterning of respective color filter sublayers of the quantum dot color filter can be achieved without the need of bank(s).

Figure 3:
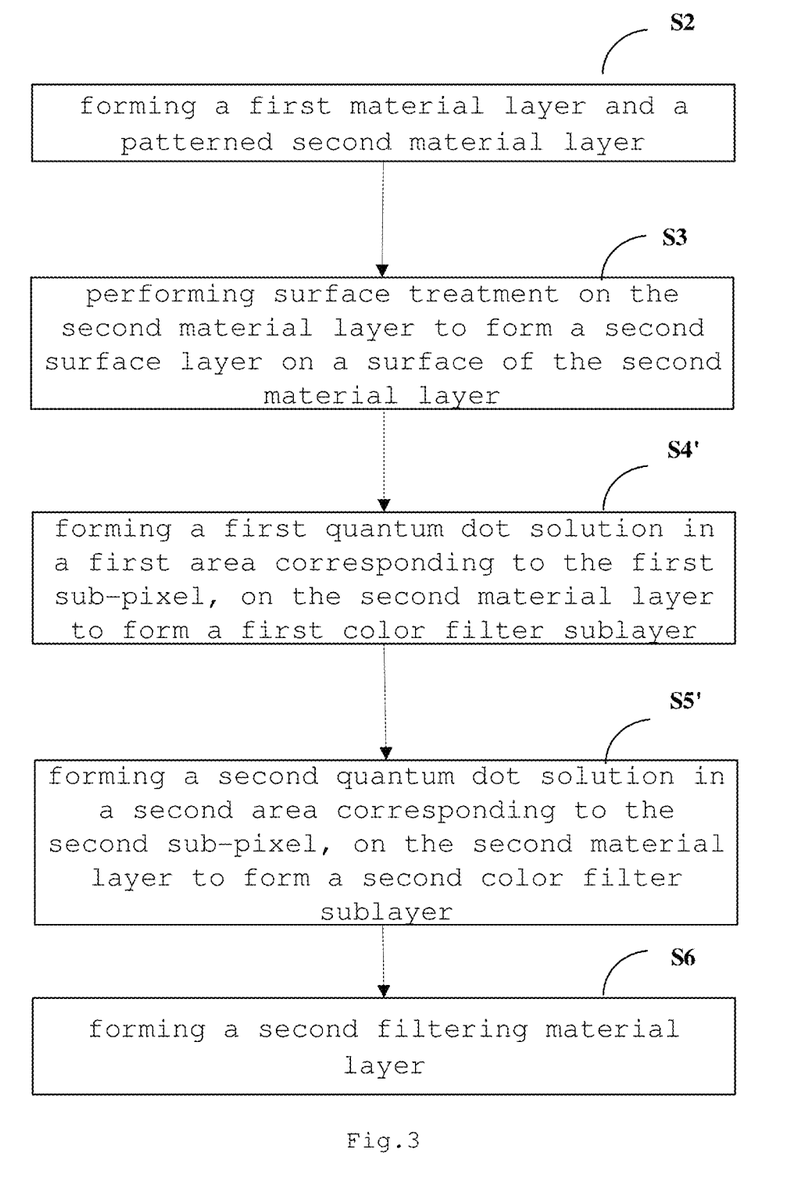
FIG. 3 is a flowchart illustrating a method of manufacturing a display substrate according to still another embodiment of the present disclosure.
Figure 4A:
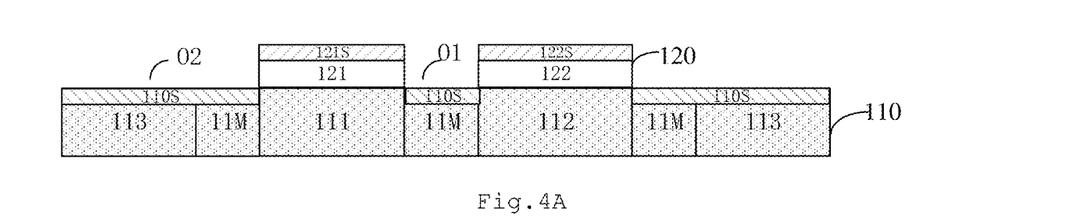
FIGS. 4A-4D are sectional views illustrating a structure obtained at various stages according to the method of FIG. 3.
Figure 4B:
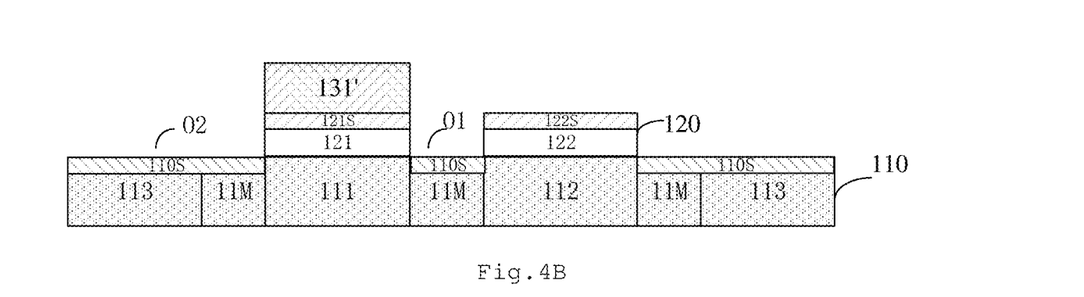
Figure 4C:
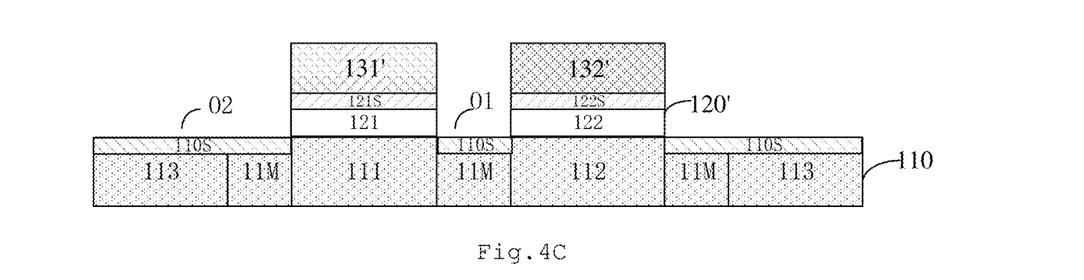

FIG. 3 is a flowchart illustrating a method of manufacturing a display substrate according to still another embodiment of the present disclosure. FIG. 3 is different from FIG. 1A in that FIG. 3 further comprises steps S3, S5, S6. FIGS. 4A to 4C are sectional views illustrating a structure obtained at various stages according to the method of FIG. 3. The flowchart shown in FIG. 3 is described below with reference to FIGS. 4A to 4C, wherein only the differences between FIG. 3 and FIG. 1 are described, and the same parts between them are omitted.

In step S3, the second material layer is subjected to a surface treatment to form a second surface layer on a surface of the second material layer.

The second material layer may be surface-treated with a mask to form the second surface layer on the surface of the second material layer. The wettability of the second surface layer to the first quantum dot solution is greater than the wettability of the second material layer to the first quantum dot solution. That is, the overall hydrophobicity of the second material layer is enhanced.

In some embodiments, the exposed first material layer is surface-treated to form the first surface layer on the exposed first material layer. The wettability of the first surface layer to the first quantum dot solution is smaller than the wettability of the first material layer to the first quantum dot solution. That is, the overall hydrophilicity of the first material layer is enhanced.

In other words, the surface treatment may be performed only on the second material layer, or the surface treatment may be performed on both the second material layer and the first material layer. The surface treatment on the first material layer and the second material layer may be performed simultaneously, or the surface treatment on the first material layer and the second material layer may be performed separately.

In some embodiments, the second material layer is surface-treated using $CF_x$ plasma.

After performing the surface treatment using $CF_x$ plasma, C—F bonds replace C—H bonds on the surface of the second material layer. Since the C—F bonds are more hydrophobic than the C—H bonds, the hydrophobicity of the second material layer is enhanced. In this process, if the first material layer is also exposed to the $CF_x$ plasma atmosphere, the surface of the first material layer will be mildly etched by the $CF_x$ plasma, and the hydrophilicity of the mildly etched surface will be enhanced.

Figure 5A:
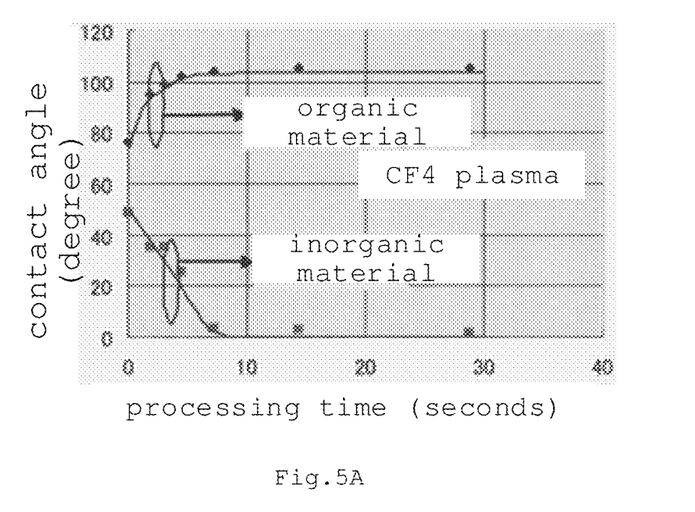
FIG. 5A is a graph illustrating a change in wettability of surfaces of different materials to water, with surface treatment over time according to an embodiment of the present disclosure.

FIG. 5A is a graph illustrating a change in wettability of surfaces of different materials to water, with surface treatment over time according to an embodiment of the present disclosure. In FIG. 5A, the first material layer is an inorganic material, the second material layer is an organic material, and surface treatment is performed using $CF_4$ plasma, and wettability is reflected by a magnitude of a contact angle. The larger the contact angle, the smaller wettability to water, i.e., the stronger the hydrophobicity; the smaller the contact angle, the greater the wettability to water, i.e., the stronger the hydrophilicity.

The surface treatment using $CF_4$ plasma can increase a difference in surface energy between the second material layer and the first material layer, and increase a difference in contact angle. As shown in FIG. 5A, after the surface treatment using $CF_4$ plasma, the contact angle of water on the organic material increases from near 80 degrees to over 100 degrees, while the contact angle on the inorganic material decreases from 50 degrees to near 0 degrees.

FIG. 4A illustrates a sectional view after the surface treatment according to an embodiment of the present disclosure. As shown in FIG. 4A, the second surface layer is formed on the surface of the patterned second material layer. That is, the second material layer 120' comprises the second surface layer, and the second surface layer comprises surface layers 121S and 122S formed on surfaces of the first and second areas 121 and 122 of the second material layer.

As described above, the first surface layer 110S is formed on the surface of the exposed first material layer. As shown in FIG. 4A, the first surface layer 110S may comprise a surface layer on the portion 11M corresponding to the area between the first sub-pixel and the second sub-pixel, and may further comprise a surface layer on the portion 113 corresponding to the third sub-pixel.

In step S4', a first color filter sublayer 131' is formed. The first color filter sublayer 131' may be formed by a process similar to that of the first color filter sublayer 131.

FIG. 4B illustrates a sectional view after forming the first color filter layer, according to yet another embodiment of the present disclosure. As shown in FIG. 4B, the first color filter sublayer 131' is located on a surface layer 121S of the second material layer 120.

In step S5', a second quantum dot solution is formed in a second area corresponding to the second sub-pixel, on the second material layer, so as to form a second color filter sublayer 132'. The second color filter sublayer 132' may also be formed by a process similar to that of the first color filter sublayer 131. The wettability of the second material layer to the second quantum dot solution is also greater than the wettability of the first material layer to the second quantum dot solution.

FIG. 4C illustrates a sectional view after forming the second color filter sublayer, according to yet another embodiment of the present disclosure. As shown in FIG. 4C, the second color filter sublayer 132' is located on a surface layer 122S of the second material layer 120.

Taking as an example that the first sub-pixel, the second sub-pixel and the third sub-pixel respectively correspond to a red sub-pixel, a green sub-pixel and a blue sub-pixel, respectively, a red color filter sublayer and a green color filter sublayer can be sequentially formed by the method shown in FIG. 1B. It should be understood that the green color filter sublayer may be formed first and then the red color filter sublayer. The order of forming the red color filter sublayer and the green color filter sublayer is not limited to the order described in the embodiments of the present disclosure.

In the above embodiments, by setting the materials in different areas to have a different wettability to the quantum dot solution, patterning of different color filter sublayers can be achieved without the need of bank(s).

In step S6, a second filtering material layer 140 is formed.

Figure 4D:
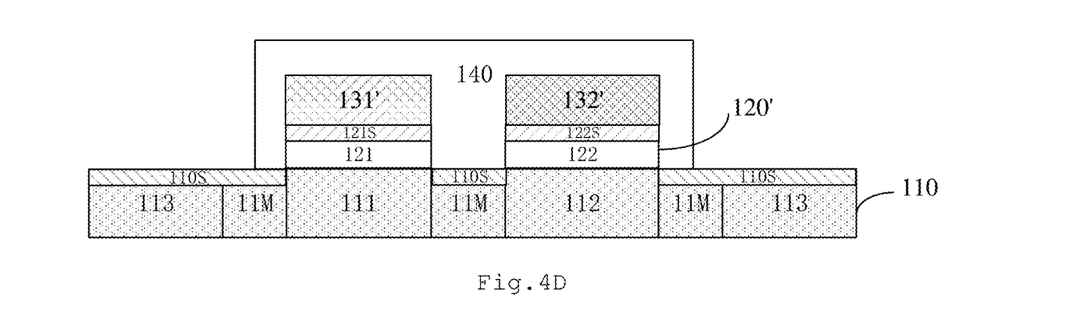

FIG. 4D illustrates a sectional view after forming the second filtering material layer according to an embodiment of the present disclosure. As shown in FIG. 4D, the second filtering material layer 140 is patterned to cover the first color filter sublayer 131' and the second color filter sublayer 132'. In some embodiments, the patterned second filtering material layer 140 also covers the portions 11M of the first material layer 110, corresponding to areas between the first and second sub-pixels.

Patterning of the second filtering material layer 140 may be achieved using a low temperature lithography process similar to the patterning of the second material layer.

The second filtering material layer is used for filtering light with a wavelength of 500 nm or less. In some embodiments, the material of the second filtering material layer comprises a pigment or dye dispersed in an organic material such as acrylic resin, epoxy resin, or the like, and the pigment or dye is capable of absorbing blue light.

Figure 5B:
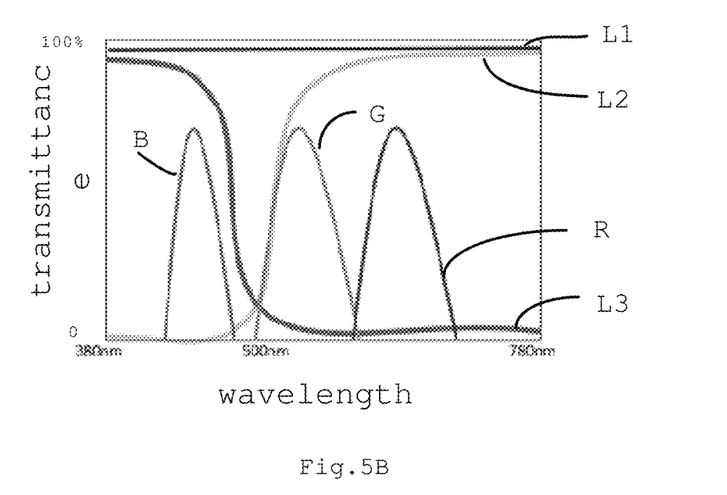
FIG. 5B is a graph illustrating a change in transmittance of light through different materials, with wavelength according to an embodiment of the present disclosure.

FIG. 5B is a graph illustrating a change in transmittance of light through different materials with wavelength, according to one embodiment of the present disclosure.

In FIG. 5B, a curve L1 represents that the transmittance of ambient light, comprising light with a wavelength of 380 nm to 780 nm, in air is 100%. A curve L2 represents the transmittance of light through the second filtering material layer, and as shown in FIG. 5B, the transmittance of light with a wavelength of less than 500 nm through the second filtering material layer is close to 0. That is, the second filtering material layer can filter out the light with a wavelength of less than 500 nm. A curve L3 represents the transmittance of light through the first filtering material layer, and as shown in FIG. 5B, the transmittance of the light with a wavelength more than 500 nm through the first filtering material layer is close to 0. That is, the first filtering material layer can filter out the light with a wavelength of more than 500 nm. A curve B represents distribution of light emitted by a blue light-emitting unit, and the wavelength of the blue light is 400 nm to 480 nm, as shown in FIG. 5B. Curves R and G respectively represent distributions of light emitted from the red color filter sublayer and the green color filter sublayer, and as shown in FIG. 5B, the wavelength of red light is 620 nm to 760 nm, and the wavelength of green light is 500 nm to 620 nm.

A quantum dot color filter of the display substrate can be formed by the method according to any one of the above embodiments. The structure of the display substrate according to an embodiment of the present disclosure is described below in conjunction with FIGS. 2B-2C and 4B-4D.

As shown in the figures, the display substrate comprises: the first material layer 110, the second material layer 120 or 120', and the first color filter sublayer 131 or 131'. The display substrate may further comprise the second color filter layer 132 or 132'. In some embodiments, the display substrate further comprises the second surface layers 121S and 122S. In some other embodiments, the display substrate further comprises the first surface layer 110S.

Figure 6:
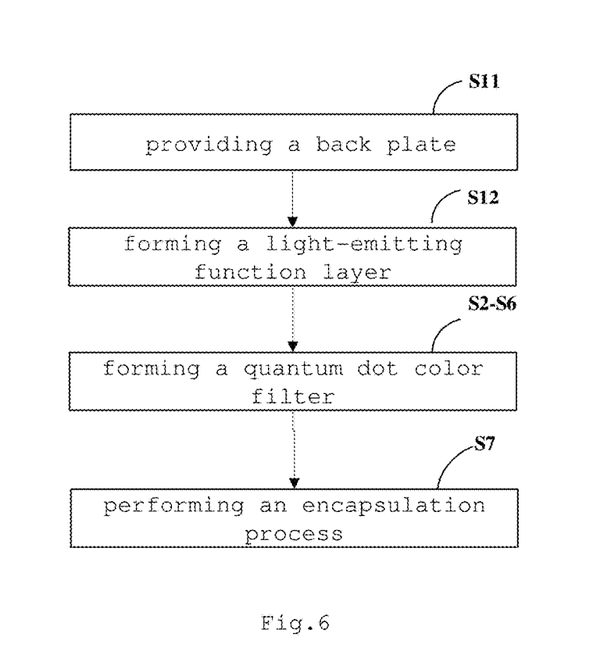
FIG. 6 is a flowchart illustrating a method of manufacturing a display substrate according to yet another embodiment of the present disclosure.

FIG. 6 is a flowchart illustrating a method of manufacturing a display substrate according to a yet another embodiment of the present disclosure. The method of manufacturing the display substrate in FIG. 6 comprises steps S11-S12 and S7, in addition to the method of manufacturing the display substrate shown in FIG. 1A, 1B or 3.

FIGS. 7A to 7E are sectional views illustrating a structure obtained at various stages according to the method of FIG. 6. The flowchart shown in FIG. 6 is described below with reference to FIGS. 7A to 7E, wherein only the differences between them are described, and the same parts are omitted.

In step S11, a back plate is provided.

Figure 7A:
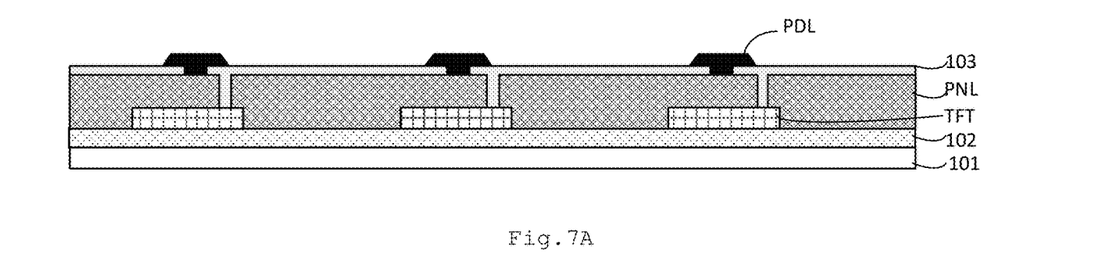
FIGS. 7A-7G are sectional views illustrating a structure obtained at various stages according to the method of FIG. 6.

FIG. 7A illustrates a sectional view of the back plate provided according to one embodiment of the present disclosure. As shown in FIG. 7A, the back plate comprises TFTs (thin film transistors) formed on a substrate structure. The substrate structure comprises a base substrate 101 and a buffer layer 102 thereon. The material of the base substrate may be, for example, glass. The material of the buffer layer 102 may be inorganic or organic. For example, the material of the buffer layer 102 may comprise at least one of silicon oxide, silicon nitride, and polyimide.

As shown in FIG. 7A, the back plate further comprises an anode material layer 103. The anode material layer 103 comprises a plurality of anode cells separated by a pixel defining layer PDL. The material of the anode material layer 103 may comprise a conductive oxide such as indium tin oxide, indium zinc oxide; a reflective metal such as silver, aluminum; and a multilayer conductive material containing the conductive oxide and the reflective metal. The anode cell is connected to the corresponding TFT, for example, to the source and drain (not specifically shown).

A planarization layer PNL is provided between the anode material layer 103 and the TFTs. The planarization layer PNL provides a planar surface for the anode material layer. The material of the planarization layer PNL comprises: at least one of polymer materials such as polymethyl methacrylate and polyimide.

In step S12, a light-emitting function layer is formed.

Figure 7B:
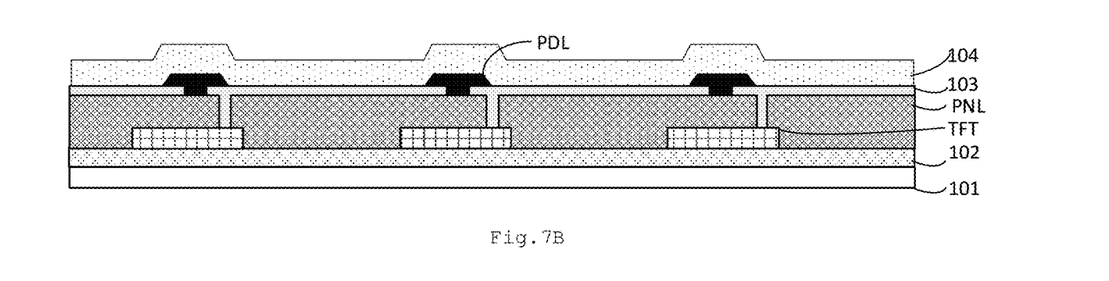

FIG. 7B illustrates a sectional view after forming the light-emitting functional layer, according to one embodiment of the present disclosure. As shown in FIG. 7B, the light-emitting function layer 104 covers the anode material layer 103 and the pixel-defining layer PDL. In some embodiments, the light-emitting material layer comprises an organic material capable of emitting blue light.

The light emitting function layer 104 comprises a light-emitting material layer. In some embodiments, the light emitting function layer 104 further comprises carrier function layers such as a hole injection layer, a hole transport layer, an electron blocking layer, a hole blocking layer, an electron transport layer, and an electron injection layer, so as to improve light emitting efficiency.

In some other embodiments, stacked light-emitting function layers are formed. For example, two or more light-emitting material layers and corresponding carrier function layers are formed.

Figure 7C:
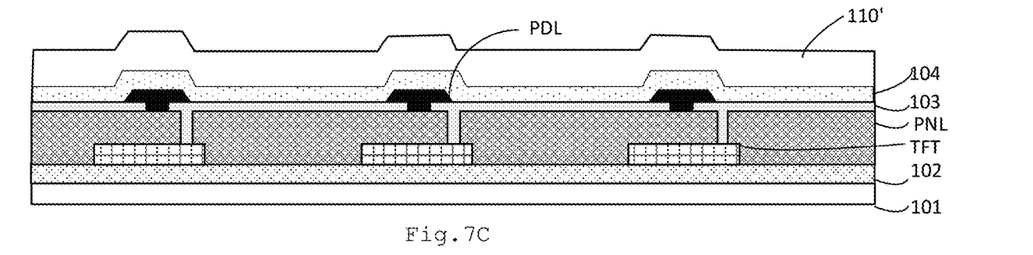

In step S2, the first material layer is formed first, as shown in FIG. 7C.

FIG. 7C illustrates a sectional view after forming the first material layer, according to one embodiment of the present disclosure. As shown in FIG. 7C, the first material layer 110' covers the light-emitting function layer 104.

In some embodiments, the first material layer 110' is formed using an evaporation process. The first material layer 110' may comprise a cathode material layer. The first material layer 110' may further comprise a thin film encapsulation layer TFE formed on the cathode material layer.

The anode material layer 103, the light-emitting function layer 104, and the first material layer 110' formed previously constitute a light-emitting unit. On this basis, a quantum dot color filter is prepared, for example, the step of forming the patterned second material layer in step S2, and steps S4-S6 are performed, so as to form the structures shown in FIGS. 7D, 7E and 7F, respectively.

Figure 7D:
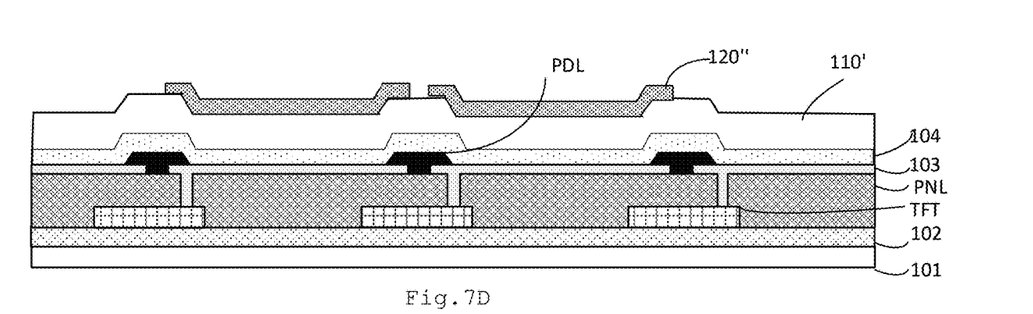
Figure 7E:
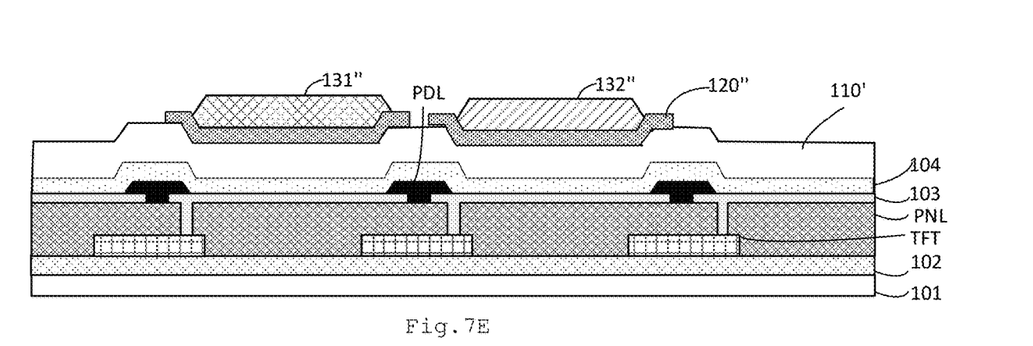
Figure 7F:
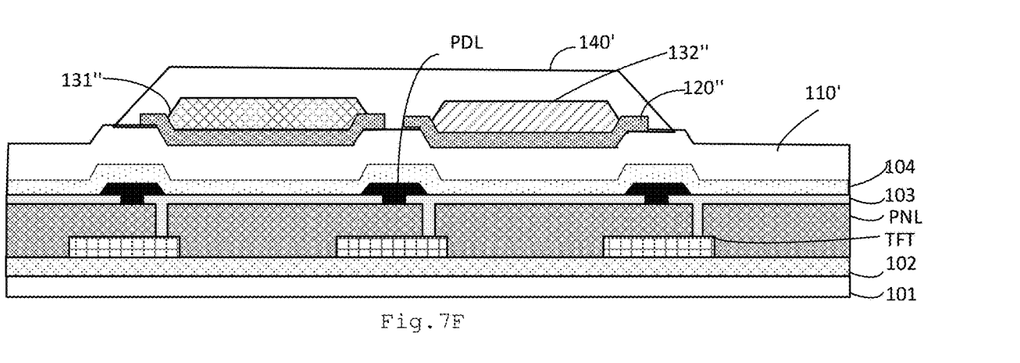

FIG. 7D is similar to FIG. 2A, with a patterned second material layer 120" covering a portion of the first material layer 110', corresponding to the first and second sub-pixels. FIG. 7E is similar to FIGS. 2B and 2C, with a first color filter sublayer 131" formed on a first area of the second material layer 120", corresponding to the first sub-pixel, and a second color filter sublayer 132" formed on a second area of the second material layer 120", corresponding to the second sub-pixel. FIG. 7F is similar to FIG. 4D, with a second filtering material layer 140' covering the first color filter sublayer 131" and the second color filter sublayer 132". In some embodiments, the second filtering material layer 140' covers the first material layer 110' and the second material layer 120" exposed between the first color filter sublayer 131" and the second color filter sublayer 132".

In step S7, an encapsulation process is performed.

Figure 7G:
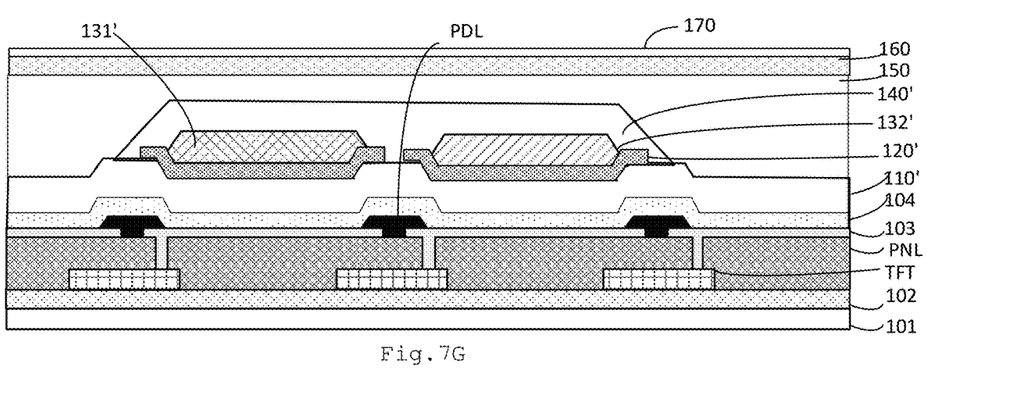

FIG. 7G illustrates a sectional view after the encapsulation process, according to some embodiments of the present disclosure. The display substrate comprises a quantum dot color filter and a light-emitting unit. The quantum dot color filter and the light-emitting unit are combined for use, for color display.

As shown in FIG. 7G, the display substrate comprises a cover plate 160 and a filling layer 150 located between the cover plate 160 and the second filtering material layer 140' of the quantum dot color filter. The material of the filling layer 150 may be acrylic resin, epoxy resin, or any combination thereof, and is used to prevent water, oxygen, and the like from entering the quantum dot color filter. The cover plate 160 may be made of glass, for example. The display substrate further comprises an optical film layer 170. The optical film layer 170 may employ TOF (Transparent Optical Film).

According to the embodiment of the present disclosure, a display device comprising the display substrate is also provided. In some embodiments, the display device may be: any product or component with a display function, such as a mobile phone, a tablet computer, a television set, a display, a notebook computer, a digital photo frame, a navigator and the like.

So far, the embodiments of this disclosure have been described in detail. In order to avoid obscuring the idea of this disclosure, some details well known in the art are omitted. A person skilled in the art can fully understand how to implement the technical solutions disclosed herein according to the above description.

Although some specific embodiments of the present disclosure have been described in detail with examples, it should be understood by a person skilled in the art that the above examples are only intended to be illustrative but not to limit the scope of the present disclosure. The above embodiments can be modified or partial technical features thereof can be equivalently substituted without departing from the scope and spirit of the present disclosure. The scope of the present disclosure is defined by the attached claims.

What is claimed is:

1. A method of manufacturing a display substrate, the display substrate comprising a plurality of pixel units, each of the plurality of pixel units comprising a first sub-pixel and a second sub-pixel, and the method comprising:
    forming a first material layer and a second material layer, wherein the first material layer comprises a portion corresponding to an area between the first sub-pixel and the second sub-pixel, and the second material layer has a first opening exposing the portion of the first material layer, corresponding to the area between the first sub-pixel and the second sub-pixel; and
    forming a first quantum dot solution in a first area corresponding to the first sub-pixel on the second material layer to form a first color filter sublayer, wherein wettability of the second material layer to the first quantum dot solution is greater than wettability of the first material layer to the first quantum dot solution.

2. The method according to claim 1, further comprises at least one of:
    performing surface treatment on the second material layer to form a second surface layer on a surface of the second material layer before the step of forming, wherein wettability of the second surface layer to the first quantum dot solution is greater than wettability of the second material layer to the first quantum dot solution; or
    performing surface treatment on the the exposed portion of the first material layer to form a first surface layer on a surface of the the exposed portion of the first material layer before the step of forming, wherein wettability of the first surface layer to the first quantum dot solution is smaller than wettability of the first material layer to the first quantum dot solution.

3. The method according to claim 2, wherein the surface treatment is performed using CFx plasma.

4. The method according to claim 1, wherein the first material layer further comprises a first portion and a second portion corresponding to the first sub-pixel and the second sub-pixel, respectively.

5. The method according to claim 1, wherein the second material layer comprises an organic material layer and the first material layer comprises a thin film encapsulation layer.

6. The method according to claim 1, wherein the second material layer comprises: a first filtering material layer for filtering out light with a wavelength of 500 nm or more.

7. The method according to claim 1, further comprising:
    forming a second quantum dot solution in a second area corresponding to the second sub-pixel, on the second material layer to form a second color filter sublayer, wherein wettability of the second material layer to the second quantum dot solution is greater than wettability of the first material layer to the second quantum dot solution.

8. The method according to claim 7, further comprising:
    forming a second filtering material layer that covers the first color filter sublayer and the second color filter sublayer, for filtering out light with a wavelength of 500 nm or less.

9. The method according to claim 1, wherein the first material layer is hydrophilic, the second material layer is hydrophobic, and the first quantum dot solution is hydrophobic.

10. The method according to claim 8, wherein:
    each of the plurality of pixel units further comprises a third sub-pixel, the second sub-pixel being located between the first sub-pixel and the third sub-pixel;
    the first material layer further comprises a third portion corresponding to the third sub-pixel; and
    the second material layer further has a second opening exposing the third portion corresponding to the third sub-pixel, of the first material layer.

11. A display substrate comprising a plurality of pixel units, each of the plurality of pixel units comprising a first sub-pixel and a second sub-pixel, and the display substrate comprising:
    a first material layer located on a base substrate and comprising a portion corresponding to an area between the first sub-pixel and the second sub-pixel;

a second material layer located on the base substrate, wherein the second material layer has a first opening exposing the portion of the first material layer, corresponding to the area between the first sub-pixel and the second sub-pixel; and a first color filter sublayer located in a first area corresponding to the first sub-pixel, on the second material layer, wherein wettability of the second material layer to a quantum dot solution for forming the first color filter sublayer is greater than wettability of the first material layer to the quantum dot solution.

12. The display substrate according to claim 11, further comprising at least one of a first surface layer or a second surface layer, wherein:
the first surface layer is located on a surface on a side of the first material layer away from the base substrate, and wettability of the first surface layer to the quantum dot solution is smaller than wettability of the first material layer to the quantum dot solution; and
the second surface layer is located on a surface on a side of the second material layer away from the base substrate, and wettability of the second surface layer to the quantum dot solution is greater than wettability of the second material layer to the quantum dot solution.

13. The display substrate according to claim 11, wherein the first material layer further comprises a first portion and a second portion corresponding to the first sub-pixel and the second sub-pixel, respectively.

14. The display substrate according to claim 11, wherein the second material layer comprises an organic material layer and the first material layer comprises a thin film encapsulation layer.

15. The display substrate according to claim 14, wherein the second material layer comprises: a first filtering material layer for filtering out light with a wavelength of 500 nm or more.

16. The display substrate according to claim 11, further comprising:
a second color filter sublayer located in a second area corresponding to the second sub-pixel, on the second material layer.

17. The display substrate according to claim 16, further comprising: a second filtering material layer that covers the first color filter sublayer and the second color filter sublayer, for filtering out light with a wavelength of 500 nm or less.

18. The display substrate according to claim 17, wherein:
each of the plurality of pixel units further comprises a third sub-pixel, the second sub-pixel being located between the first sub-pixel and the third sub-pixel;
the first material layer further comprises a third portion corresponding to the third sub-pixel; and
the second material layer further has a second opening exposing the third portion corresponding to the third sub-pixel, of the first material layer.

19. The display substrate according to claim 11, further comprising:
a light-emitting unit located on the base substrate, wherein the first color filter sublayer is arranged on a light-emitting side of the light-emitting unit.

20. A display device, comprising the display substrate according to claim 11.

* * * * *

UNITED STATES PATENT AND TRADEMARK OFFICE
CERTIFICATE OF CORRECTION

PATENT NO. : 11,387,285 B2
APPLICATION NO. : 16/760223
DATED : July 12, 2022
INVENTOR(S) : Youngsuk Song It is certified that error appears in the above-identified patent and that said Letters Patent is hereby corrected as shown below:

In the Claims

Column 12, Line 16, Claim 2, delete "the the" and insert -- the --

Column 12, Line 18, Claim 2, delete "the the" and insert -- the --

Signed and Sealed this
Twentieth Day of September, 2022

Katherine Kelly Vidal
*Director of the United States Patent and Trademark Office*